United States Patent [19]

Tsuchiya

[11] Patent Number: 4,858,554
[45] Date of Patent: Aug. 22, 1989

[54] SOLDER COATING APPARATUS
[75] Inventor: Tomio Tsuchiya, Shizuoka, Japan
[73] Assignee: Fuji-Seiki Machine Works, Ltd., Shizuoka, Japan
[21] Appl. No.: 238,923
[22] Filed: Aug. 31, 1988
[30] Foreign Application Priority Data
Sep. 2, 1987 [JP] Japan .................. 62-217956
[51] Int. Cl.$^4$ ............... B05C 1/02; B05C 1/08
[52] U.S. Cl. .................. 118/224; 118/74; 118/227; 118/241; 118/249
[58] Field of Search ............ 118/74, 216, 220, 228, 118/224, 225, 227, 241, 249, 244, 258, 263

[56] References Cited
U.S. PATENT DOCUMENTS

| | | | |
|---|---|---|---|
| 1,654,214 | 12/1927 | Evans | 118/221 |
| 1,707,611 | 4/1929 | Hamburger et al. | 118/227 |
| 1,788,610 | 1/1931 | Ashworth et al. | 118/227 |
| 2,588,967 | 3/1952 | Davis | 118/74 |
| 2,935,963 | 5/1960 | Aamot | 118/216 |
| 3,006,318 | 10/1961 | Monroe, Jr. et al. | 118/227 |
| 3,882,816 | 5/1975 | Booz et al. | 118/74 |
| 3,958,039 | 5/1976 | Yabuki et al. | 118/227 |
| 4,594,962 | 6/1986 | Focke | 118/223 |
| 4,799,450 | 1/1989 | Cornellier | 118/74 |

FOREIGN PATENT DOCUMENTS 526301 9/1940 United Kingdom .

Primary Examiner—Willard Hoag
Attorney, Agent, or Firm—Flynn, Thiel, Boutell & Tanis

[57] ABSTRACT

A soldering machine for simultaneously applying liquid solder to opposite sides of the leads of a lead frame having I.C. devices thereon. The machine has sidewardly spaced rolls which define a vertically extending narrow nip therebetween through which the lead frame passes. A solder bath is disposed below the rolls so that the lower portions of the rolls dip into the bath and carry a solder film to the nip for application to opposite sides of the leads. A passage extends upwardly in isolation from the bath for permitting the lead frame to be fed vertically through the nip.

9 Claims, 3 Drawing Sheets

SOLDER COATING APPARATUS

FIELD OF THE INVENTION

This invention relates to an apparatus for solder coating leads associated with a lead frame containing I.C. devices.

BACKGROUND OF THE INVENTION

An I.C. (integrated circuit) device is formed by an I.C. chip capsulated within a resin package, as by a molding operation, and the chip connects to a plurality of pins (generally referred to as "leads") which project outwardly beyond the sides of the resin package. These leads are part of a lead frame which is generally elongated so that several such I.C. devices are formed longitudinally in spaced relationship therealong, with the I.C. devices thereafter being severed from the longitudinally extending edge strips of the lead frame.

As is well known, the leads are typically coated with solder, with the coating generally occurring in one of two different ways. In a first common technique, each I.C. device is separated from the lead frame, its leads are then bent downwardly substantially at right angles, and the bent leads are then dipped into a bath of liquid solder. The second conventional technique involves maintaining the plurality of I.C. devices integrally connected to the elongate lead frame so as to define a relatively flat package having a plurality of I.C. devices thereon, with this package in its entirety then being dipped into a bath of liquid solder.

The above techniques are known to possess several disadvantages. In an attempt to improve thereon, the Assignee of this invention has developed an apparatus for permitting solder coating of solely the leads while maintaining a plurality of I.C. devices connected to a common lead frame, such apparatus being illustrated by copending application Ser. No. 100,189, filed Sept. 23, 1987 now U.S. Pat. No. 4,836,131.

Accordingly, the present invention relates to improvements with respect to an apparatus for solder coating of leads associated with a plurality I.C. devices as mounted on a common lead frame.

In the improved apparatus of this invention, a pair of solder coating rolls are urged inwardly toward one another to define a gap through which the lead frame passes to permit simultaneous coating of opposite sides of the leads. The rolls are urged against an adjustable stop arrangement to define a gap therebetween which is adjusted to slightly exceed the width of the lead frame so that the solder coating on the rolls will automatically center the lead frame between the rolls and ensure application of a desired thickness of solder. At the same time the rolls drivingly move the lead frame through the gap. The rolls are mounted in cantilevered fashion from a pair of pivotally-mounted supports, which supports have counter-rotating meshing drive gears associated therewith at the pivot axes to drive the rolls.

Other objects and purposes of the invention will be apparent to persons familiar with apparatus of this general type upon reading the following specification and inspecting accompanying drawings.

DETAILED DESCRIPTION

Figure 4:
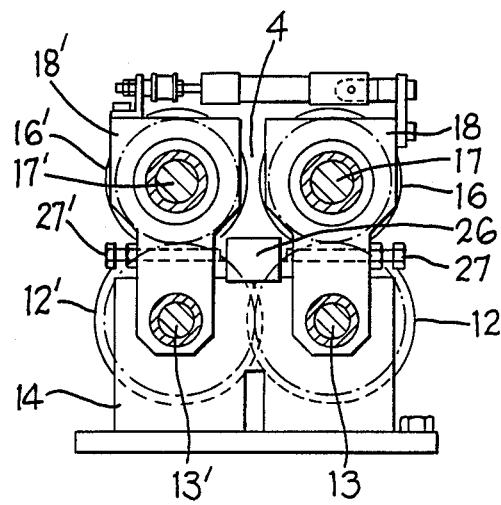
FIG. 4 is a sectional view taken substantially along line B—B in FIG. 2.
Figure 5:
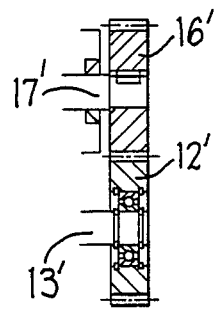
FIG. 5 is a sectional view taken substantially along line C—C in FIG. 2.
Figure 1:
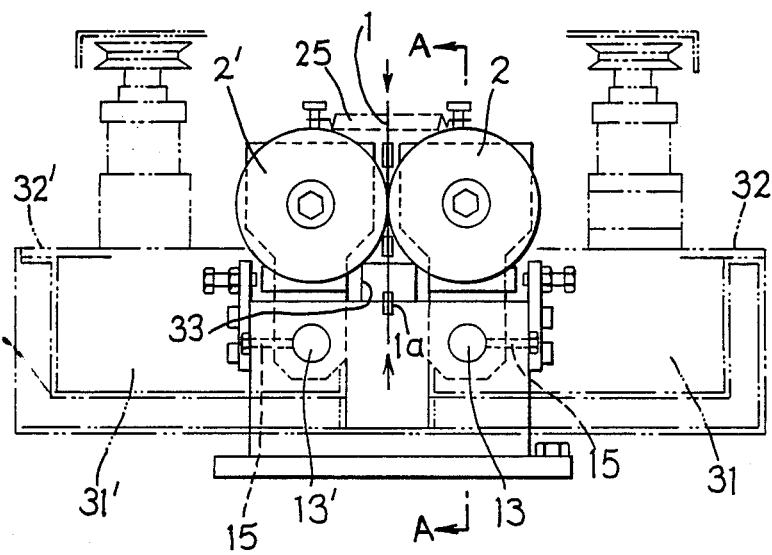
FIG. 1 is a front view of a preferred embodiment of the solder coating apparatus.
Figure 2:
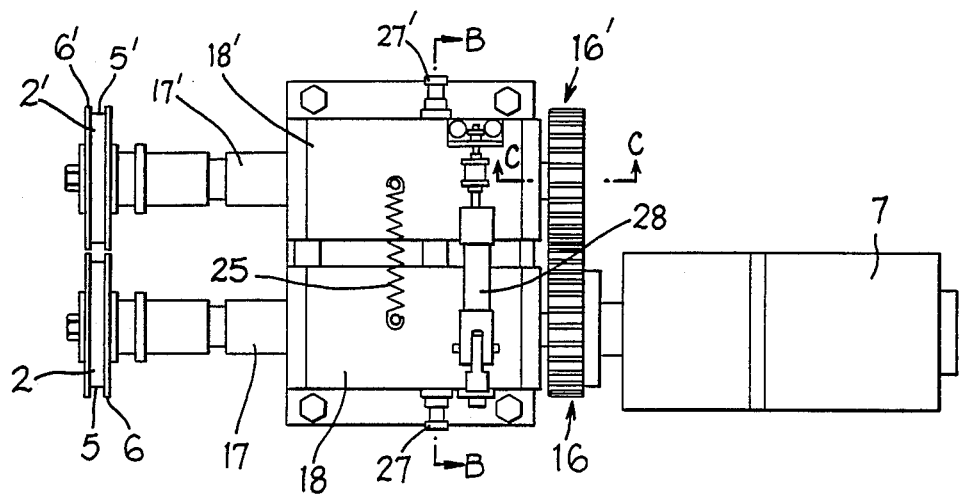
FIG. 2 is a top view thereof.
Figure 3:
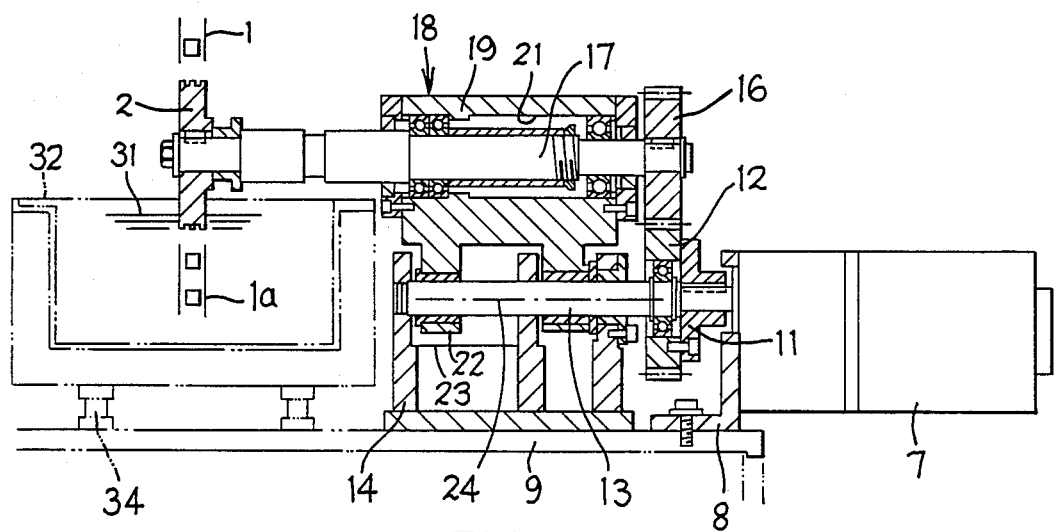
FIG. 3 is a sectional view taken substantially along line A—A in FIG. 1.

FIGS. 1 and 3 diagrammatically illustrate a lead frame 1 which, as is generally conventional, has a plurality of resin packages 1a disposed in spaced relationship longitudinally therealong. Leads project outwardly from opposite-sides of the resin package and are joined to elongated edge strips which extend longitudinally along and define the lead frame. The lead frame may comprise individual elongate strips each having a plurality of resin packages thereon, or it may comprise an elongate substantially continuous ribbon, both types being conventional.

To effect coating of the lead frame, the apparatus includes a pair of rolls 2,2' which are disposed horizontally sidewardly in closely adjacent relationship to define a narrow vertically-extending gap 4 therebetween for accommodating the lead frame 1. The rolls typically have an outer cylindrical profile which includes a recess 5,5' which surrounds the roll and is axially bordered by flanges, which flanges on the outer cylindrical surfaces 6,6' are adapted for effecting solder coating of the leads associated with the lead frame. The recess 5,5' is designed to loosely accommodate the resin package 1a so that the latter will be free of exposure to the molten solder.

To effect rotational driving of the rolls 2,2' in opposite rotational directions, the apparatus includes a driven motor 7 attached to a bracket 8 which is fixed to and projects upwardly from a base or support plate 9, the latter constituting a part of the frame or housing of the apparatus. The drive shaft of motor 7 has a clutch-type coupler 11 secured thereto, and the latter is adapted to be directly drivingly engaged with a driving gear 12 to effect rotation of the latter. This driving gear 12 in turn is directly meshingly engaged with a sidewardly-adjacent driving gear 12'. These gears 12,12' are rotatably supported on the outer ends of generally parallel and horizontally disposed support spindles 13,13', which spindles are nonrotatably secured on spaced upwardly projecting brackets 14 which are fixed to the base plate. The spindles 13,13' can be suitably nonrotatably fixed relative to the brackets 14 in any conventional manner, such as by locking screws 15,15'.

The driving gears 12,12' in turn respectively directly meshingly engage driven gears 16,16' which are disposed substantially directly over the driving gears. These driven gears 16,16' are slightly sidewardly spaced apart, and in turn are nonrotatably secured to the rearward ends of drive shafts 17,17'. These shafts 17,17' have the rolls 2,2' respectively nonrotatably secured thereto adjacent the forward ends thereof.

The drive shafts 17,17' are respectively rotatably supported on lever-like supports 18,18' which are disposed for individual pivotal movement relative to the housing and relative to one another.

The support 18 at its upper end includes a generally elongate sleeve-like housing part 19 which defines an elongate bore 21 extending therethrough. The drive shaft 16 is rotatably supported within this bore and disposed so as to project outwardly from opposite ends thereof, with the forward end portion of the drive shaft being cantilevered outwardly (leftwardly in FIG. 3) a substantial extent beyond the sleeve part 19. The bracket 18 also has several downwardly projecting bracket arms 22 provided with appropriate journal bearings 23 which rotatably (i.e, pivotally) mount the support 18 for arcuate swinging movement substantially about the axis 24 of the stationary spindle 13.

The other support 18' is similarly constructed and is supported for swinging movement about the axis of the other stationary spindle 13'.

The supports 18,18' are normally biased to swing inwardly toward one another to cause the rolls 2,2' to approach one another, and for this purpose a biasing means formed as a spring 25 extends between the sleeve parts 19,19' so that the supports are urged in opposite rotational directions toward one another to maintain a minimum gap 4 between the rolls 2,2'.

To adjustably control the width of the gap 4 and the opposed inward approach of the supports 18,18' and drive shafts 17,17' toward one another, there is provided an adjustable stop arrangement. This adjustable stop arrangement includes a stop block 26 which is fixed to the stationary bracket 14 and a pair of adjustable stop members (specifically screws) 27,27' which are respectively threadedly mounted on the supports 18,18' and have the free ends thereof disposed for abutting contact with opposite side surfaces of the stop block 26. With this arrangement, the spring 25 urges the supports 18,18' inwardly toward one another until the screws 27,27' abut opposite sides of the stop block 26 to hence define a desired minimum gap 4 between the solder coating rolls 2,2'.

The sleeve parts 19,19' of the movable supports are also connected by a fluid pressure cylinder 28, the latter having one end of the housing joined to one sleeve part 19 and the free end of the piston joined to the other sleeve part 19'. The cylinder 28 can be rapidly pressurized to effect outward separation between the rolls 2,2' when desired, such as for maintenance or adjustment purposes, or for initial insertion of the lead frame into the gap.

The solder coating apparatus also includes a pair of molten solder baths 31,31' which, in the illustrated embodiment, are defined by separate sidewardly-disposed tank structures 32,32' which have a clearance space 33 therebetween for permitting vertical passage of the lead frame. However, it will be appreciated that the two baths can be united within a single tank so long as the tank has an upwardly opening tunnel or passage therethrough equivalent to the space 33 for permitting passage of the lead frame.

The movable supports 18,18' are swingably supported closely adjacent one side of the molten baths, and the driven shafts 17,17' project in a cantilever fashion outwardly so as to overhang the baths, whereupon the rolls 2,2' are disposed directly over the baths. The elevation of the rolls 2,2' relative to the surface level of the molten solder is such that the lower parts of the rolls 2,2' dip into the molten solder so as to permit solder to be picked up onto the rolls during rotation thereof.

In operation, the lead frame 1 can be either manually or automatically fed into the gap 4 between the rolls 2,2', and in some instances the lead frame, particularly when of an elongated ribbon form, is provided with a dummy leader on the end to facilitate initial feeding into the gap between the rolls. In many instances, the cylinder 28 is activated to separate the rolls 2,2' to facilitate the initial positioning of the lead frame therebetween, following which the cylinder is de-energized so that the spring 25 retracts the rolls until the stop screws 27,27' contact the stop blocks.

The stop screws 27,27' are preferably initially adjusted relative to the stop block 26 so that, due to the urging of the spring 25, the screws normally abut the stop block and maintain a predetermined gap which slightly exceeds the thickness of the lead frame. This predetermined gap width preferably equals the thickness of the lead frame plus twice the desired coating thickness. In this respect, the preferred coating thickness is normally about 0.03 mm to about 0.08 mm, so that the gap width between the rolls exceeds the thickness of the lead frame by about 0.06 mm to about 0.016 mm.

During the counter rotation of the rolls 2,2', the rolls dip into the solder baths and then carry solder on the surface of the rolls upwardly into the gap 4 for applying a film coating of the solder to opposite sides of the lead frame. By controlling the gap width relative to the lead frame thickness, such as within the range specified above, the solder effectively creates a film on opposite sides of the lead frame and hence effectively maintains the lead frame in a centered relationship between the rolls as it passes through the gap. At the same time, not only does this result in application of substantially uniform thickness solder films on opposite sides of the leads, but it also enables the rolls 2,2', due to the surface tension of the molten solder, to act as driving rolls for moving the lead frame through the gap at a linear velocity which substantially corresponds to the peripheral velocity of the rolls. Hence, a separate drive mechanism for moving the lead frame through the gap is not required.

The cylinder 28 can also be energized to separate the rolls when excessive solder tends to build up at the upper end of the nip between the rollers.

Figure 6:
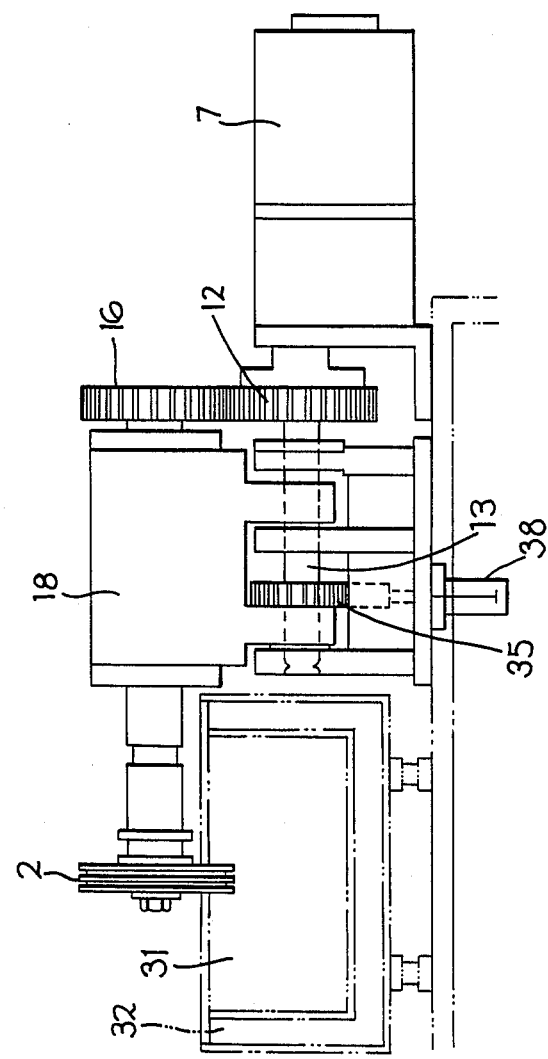
FIGS. 6 and 7 respectively illustrate side and front elevational views of a variation.
Figure 7:
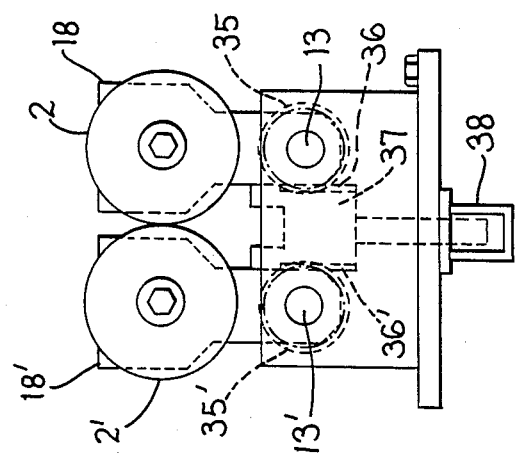

Referring now to FIGS. 6 and 7, there is illustrated a variation of the apparatus wherein the downwardly projecting arms associated with the movable supports 18,18' have pinions 35,35' fixedly mounted thereon in concentric relationship to the stationary support spindles 13,13'. These latter pinions in turn are disposed in direct meshing engagement with elongate gear racks 36,36' fixedly provided on opposite sides of a slide 37 which is vertically slidably supported on the housing. This slide 37 at its lower end connects to a fluid pressure cylinder 38 which controls vertical displacement of the gear racks. By means of energization of this cylinder and hence displacement of the slide to a desired position, this can control swinging of the supports 18,18' toward and away from one another to control the gap between the solder coating rolls.

In addition to the structure described above for enabling relative swinging of the movable supports toward and away from one another, the apparatus of FIGS. 6-7 is also preferably provided with an adjustable mechanical stop mechanism similar to that illustrated in the embodiments of FIGS. 1-5 for precisely defining the minimum gap width. In this of FIGS. 6-7, however, the biasing spring 25 and the opening cylinder 28 as utilized in the preferred embodiment can be eliminated. In addition, with this FIGS. 6-7 embodiment, the stop mechanism for controlling gap between the rolls could also be defined by providing appropriate adjustable stopping parts which cooperate between the housing and the movable slide.

With the apparatus of the present invention, the leads on the packaged I.C. device can be desirably and simultaneously coated on both sides with melted solder since the lead frame is passed between the opposed solder coating rolls which, due to their lower parts being immersed in the melted solder bath, simultaneously apply a thin film of solder on the opposite surfaces of the leads. The control over the gap between the opposed rolls permits control over the film of solder applied to the leads, thereby achieving desired uniformity of the film to achieve a proper coating of the leads without causing undesired bridging of solder in the gaps between adjacent leads, and without causing application of hot solder to the resin package. Control is further enhanced not only due to the precise adjustability of the gap between the rolls, but also by regulating the roll speed such as due to the adjustability of the speed of the drive motor 7, and by also adjusting the depth of immersion of the rolls into the baths, such as by providing the baths on vertically adjustable legs 39.

Further, the manner in which in the rolls are rotatably driven, coupled with the manner in which the rolls are supported adjacent the outer ends of the cantilever drive shafts, greatly facilitates the manufacture and maintenance of the apparatus, and in particular facilitates the interchangability of the solder coating rolls to accommodate lead frames of different configurations.

Although a particular preferred embodiment of the invention has been disclosed in detail for illustrative purposes, it will be recognized that variations or modifications of the disclosed apparatus, including the rearrangement of parts, lie within the scope of the present invention.

The embodiments of the invention in which an exclusive property or privilege is claimed are defined as follows:

1. In a solder machine for simultaneously applying thin solder coatings to opposite sides of leads associated with a plurality of I.C. devices as mounted in longitudinally spaced relationship on an elongate lead frame, comprising:

frame means;

tank means including first and second sidewardly spaced chambers containing a molten liquid solder bath therein and disposed on opposite sides of a narrow vertically extending passage for permitting a lead to pass vertically therethrough, the level of the molten solder bath in said chambers being substantially the same and at an elevation slightly below the elevation of the upper end of the passage;

first and second movable supports pivotally mounted on said frame means for pivoting movement about respective first and second pivot axes, said first and second pivot axes extending generally horizontally and being disposed in generally spaced but parallel relationship;

first and second drive shafts respectively rotatably supported on said first and second movable supports, said first and second drive shafts respectively defining first and second rotational axes which extend generally horizontally in sidewardly spaced and parallel relationship with one another, said first and second rotational axes being disposed generally parallel with and spaced radially a substantial distance from the respective first and second pivot axes, and each of said first and second drive shafts including an elongated cantilever shaft portion which projects outwardly from said frame means so as to be disposed directly above said chambers;

first and second solder coating rolls respectively nonrotatably secured to the cantilever shaft portions of said first and second drive shafts adjacent the free ends thereof, said first and second rolls being disposed sidewardly closely adjacent but slightly spaced from one another to define a narrow nip therebetween which is vertically aligned above said passage, said first and second rolls being vertically disposed relative to the chambers so that only the lower portions of said rolls dip into the molten solder bath, said rolls defining therein a radially inwardly directed recess which extends angularly around the periphery thereof for loosely accommodating the resin package associated with the I.C. devices therein to prevent application of hot molten solder to the resin package;

control means for effecting simultaneous swinging movement of said first and second supports inwardly toward one another for maintaining said supports in an innermost position to maintain a minimum predetermined width at said nip; and drive means drivingly connected to said first and second drive shafts for causing simultaneous and synchronized rotation of said drive shafts and of said rolls in opposite rotational directions.

2. A machine according to claim 1, wherein said drive means include first and second driving gears rotatably supported on said frame means for rotation about said first and second pivot axes respectively, said first and second driving gears being disposed in direct meshing engagement with one another, first and second driven gears respectively nonrotatably secured to said first and second drive shafts, said first and second driven gears being disposed in direct meshing engagement with said first and second driving gears respectively, and drive motor means drivingly coupled to said first driving gear.

3. A machine according to claim 2, wherein each said drive shaft has a rearward end thereof which projects outwardly from the respective said support, and the respective said driven gear being nonrotatably mounted on the rearward end of the respective drive shaft.

4. A machine according to claim 1, wherein said control means include first and second gears nonrotatably fixed to the respective first and second supports in generally concentric relationship with respect to the respective first and second pivot axes, and vertically reciprocal gear rack means having oppositely directed first and second gear racks thereon, said gear rack means being disposed directly between said first and second gears so that said first and second gear racks respectively directly meshingly engage said first and second gears for effecting simultaneous rotational displacement of said first and second gears in opposite rotational directions in response to linear displacement of said gear rack means.

5. A machine according to claim 1, wherein the first chamber and the second chamber in which liquid solder material is contained are connected by two passages at the respective ends of each opposing wall of the chambers for keeping the liquid solder material in said two chambers at the same level of liquid, and wherein the work piece passes through the space surrounded by said two opposing walls of said two chambers and two opposing walls of the passages connecting said two chambers.

6. A machine according to claim 1, wherein said control means include a stop member fixed to said frame means and a stop element movably adjustably supported on each of said supports and disposed for abutting engagement with said stop member for defining said innermost position.

7. A machine according to claim 6, wherein said control means includes spring means coacting with said first and second supports for urging both of said supports inwardly toward one another into said innermost position.

8. A machine according to claim 7, wherein said drive means include first and second driving gears rotatably supported on said frame means for rotation about said first and second pivot axes respectively, said first and second driving gears being disposed in direct meshing engagement with one another, first and second driven gears respectively nonrotatably secured to said first and second drive shafts, said first and second driven gears being disposed in direct meshing engagement with said first and second driving gears respectively, and drive motor means drivingly coupled to said first driving gear.

9. A machine according to claim 8, wherein each said drive shaft has a rearward end thereof which projects outwardly from the respective said support, and the respective said driven gear being nonrotatably mounted on the rearward end of the respective drive shaft.

* * * * *